United States Patent
Fujishima (10) Patent No.: US 7,357,846 B2
(45) Date of Patent: Apr. 15, 2008

(54) SUBSTRATE PROCESSING APPARATUS AND SUBSTRATE PROCESSING METHOD

(75) Inventor: Sadayuki Fujishima, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 279 days.

(21) Appl. No.: 10/900,576

(22) Filed: Jul. 27, 2004

(65) Prior Publication Data

US 2005/0027387 A1 Feb. 3, 2005

(30) Foreign Application Priority Data

Jul. 30, 2003 (JP) .............................. 2003-282342

(51) Int. Cl.
C23F 1/00 (2006.01)
C23C 16/00 (2006.01)
H01L 21/306 (2006.01)

(52) U.S. Cl. ..................... 156/345.32; 156/345.31; 118/719; 414/935; 414/937

(58) Field of Classification Search ........... 156/345.22, 156/345.31, 342.32
See application file for complete search history.

(56) References Cited

U.S. PATENT DOCUMENTS

| | | | | |
|---|---|---|---|---|
| 5,512,320 A | * | 4/1996 | Turner et al. ........... | 427/255.21 |
| 6,206,974 B1 | * | 3/2001 | Iida et al. ................... | 118/719 |
| 6,488,778 B1 | * | 12/2002 | Ballantine et al. .......... | 118/719 |
| 2001/0004066 A1 | * | 6/2001 | Toshima et al. .............. | 216/13 |
| 2002/0102852 A1 | * | 8/2002 | Verhaverbeke et al. ..... | 438/690 |
| 2003/0084918 A1 | * | 5/2003 | Kim ........................... | 134/1.2 |
| 2003/0108823 A1 | * | 6/2003 | Muraoka et al. ............ | 430/329 |

FOREIGN PATENT DOCUMENTS

JP          10-335298         12/1998

* cited by examiner

*Primary Examiner*—Karla Moore
(74) *Attorney, Agent, or Firm*—Morrison & Foerster LLP (57) ABSTRACT

In a resist-removing process system 1 for removing a resist film formed on a wafer W, the resist film is denatured so as to make the resist film soluble in water and, then, the resist film is removed from the wafer by applying a water-wash processing to the denatured resist film. A series of the denaturing processing and the water-wash processing are carried out such that the denaturing processing of the resist film, which requires a long processing time, is performed by alternately using batch type resist-denaturing process units 21*a* and 21*b* each permitting a plurality of wafers W to be processed simultaneously, and the water-wash processing requiring a processing time shorter than that of the denaturing processing of the resist film is carried out by simultaneously operating six water-wash process units 22*a* to 22*f* each applying a water-wash processing to the wafers W one by one.

16 Claims, 5 Drawing Sheets

FIG.6

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for consecutively processing substrates.

2. Description of the Related Art

In the manufacturing process of a semiconductor device, a batch processing, in which a plurality of semiconductor wafers are processed simultaneously, and a single wafer processing, in which semiconductor wafers are processed one by one, are selected appropriately in accordance with, for example, the kind of the processing and the number of semiconductor wafers to be processed.

For example, Japanese Patent Disclosure (Kokai) No. 10-335298 discloses a processing system comprising a plurality of process units for consecutively performing a plurality of different kinds of processing that deeply relates to each other with respect to a semiconductor wafer, and a transfer means for transferring the semiconductor wafer among these process units. The particular processing system was constructed in the past to include as a plurality of process units a plurality of batch process units alone or a plurality of single wafer process units alone.

However, various materials have come to be used in recent years for the manufacture of a semiconductor device. In this connection, various new processing methods have come to be proposed. Such being the situation, where a plurality of different kinds of processing are carried out consecutively, a large difference in the processing time is generated depending on the kind of the processing that is carried out. If the particular processing is carried out by the conventional processing system quoted above, a serious problem is generated that the through-put of the entire processing system is lowered.

It may be possible to prevent the through-put of the entire processing system from being lowered by constructing a single processing system such that the number of process units for carrying out a processing requiring a long processing time is larger than the number of process units for carrying out a processing that does not require a long processing time. In this case, however, it is unavoidable for the entire processing system to be rendered bulky. Also, the number of process units included in the processing system is increased so as to render costly the processing system. Further, an additional problem is generated that the construction and the control relating to the supply and the discharge of the processing fluid used in each of the process units are rendered complex, with the result that good processed articles are unlikely to be obtained.

BRIEF SUMMARY OF THE INVENTION

An object of the present invention is to provide a compact substrate processing apparatus that permits a series of different kinds of processing to be carried out efficiently and a substrate processing method that is carried out by using the particular substrate processing apparatus.

According to a first aspect of the present invention, there is provided a substrate processing apparatus for applying a prescribed processing to a substrate, comprising:

a batch processing section for applying a prescribed processing to a plurality of substrates;

a single wafer processing section for applying another processing to a single substrate; and a first substrate transfer mechanism for transferring the substrates one by one between the batch processing section and the single wafer processing section, wherein the processing performed in the batch processing section and the processing performed in the single wafer processing section are sequentially performed.

It is desirable for the substrate processing apparatus of the present invention to comprise further a container disposing section on which a container capable of housing a plurality of substrates is disposed, and a second substrate transfer mechanism for taking the substrate out of the container disposed on the container disposing section so as to transfer the substrate to one of the batch processing section and the single wafer processing section, wherein a plurality of substrates taken out of the container are processed simultaneously in the batch processing section, and the substrates taken out of the container are processed one by one in the single wafer processing section. Also, in order to increase the through-put of a series of different kinds of processing carried out in the substrate processing apparatus, it is desirable for the number of singe wafer process sections included in the substrate processing apparatus to be larger than the number of batch processing sections included in the substrate processing apparatus.

It is desirable for the substrate processing apparatus of the present invention to comprise further a container disposing section on which a container capable of housing a plurality of substrates is disposed, and a second substrate transfer mechanism for taking simultaneously a plurality of substrates out of the container disposed on the container disposing section so as to transfer the substrates to the batch processing section, wherein the first substrate transfer mechanism is constructed to transfer the substrates after the processing in the batch processing section one by one from the batch processing section into the single wafer processing section. In this case, it is desirable for the substrate processing apparatus to be constructed such that the substrate processing apparatus further includes a substrate housing section for housing temporarily a plurality of substrates after the processing in the single wafer processing section, the first substrate transfer mechanism is further capable of transferring one by one the substrates after the processing in the single wafer processing section into the substrate housing section, and the second substrate transfer mechanism is capable of taking out simultaneously a plurality of substrates housed in the substrate housing section so as to transfer these substrates into the container disposed on the container disposing section. The particular construction permits transferring smoothly the substrates within the substrate processing apparatus. Also, it is desirable for the substrate processing apparatus to be constructed such that the first substrate transfer mechanism and the second substrate transfer mechanism are capable of gaining access to the batch processing section in different directions. The particular construction permits simplifying the construction of the substrate transfer system within the substrate processing apparatus.

In order to increase the through-put, it is desirable for the substrate processing apparatus to comprise a plurality of single wafer processing sections, and for at least two of these single wafer processing sections to be used simultaneously. Likewise, it is desirable for the substrate processing apparatus to comprise a plurality of batch processing sections. In this case, if the operation of the plural batch processing sections is switched such that the operation of a certain batch processing section is switched to the operation of another batch processing section after the operation of the certain batch processing section is finished, the operations of the batch processing sections can be controlled easily. It is desirable for the number of substrates that can be transferred simultaneously by the second substrate transfer mechanism to be determined such that the processing in the batch processing section and the processing in the single wafer processing section can be consecutively carried out smoothly in just proportion in accordance with the tact time of the processing in each of the batch processing section and the single wafer processing section.

The substrate processing apparatus of the present invention can be used suitably in, for example, an apparatus in which the resist film, which has been rendered unnecessary in the manufacturing process of, for example, a semiconductor device, is denatured so as to be rendered soluble in water by the treatment with a process gas containing ozone and water vapor, followed by washing the water-soluble resist film with water so as to remove the resist film from the substrate. For example, where the resist film is cured by an ion implantation with a high dose, a long time is required for the treatment with the process gas containing ozone and a water vapor, and the water-wash treatment can be finished in a short time, compared with the treatment with the process gas noted above. Such being the situation, the denaturing treatment of the resist film is performed in the batch processing section, and the water-wash treatment of the resist film, which was denatured so as to be rendered soluble in water, is carried out in the single wafer processing section.

Incidentally, in the case of carrying out such a resist removing treatment as pointed out above, it is desirable to use an ozone supply source in which the ozone supply is controlled to permit the ozone gas to be supplied into only some of the batch processing section that are selected from a plurality of batch processing sections and to use a water vapor supply source that permits supplying the water vapor into each of a plurality of batch processing sections. The particular construction makes it possible to perform the process control easily in the batch processing section.

According to a second aspect of the present invention, there is provided a substrate processing method, which is performed by using the substrate processing apparatus of the present invention described above. To be more specific, according to a second aspect of the present invention, there is provided a substrate processing method, in which substrates are successively processed by a substrate processing apparatus comprising a batch processing section and a plurality of single wafer processing sections, comprising the steps of:

simultaneously applying a prescribed first processing to a plurality of substrates in the batch processing section;

transferring one by one the substrates after the processing in the batch processing section into the plural single wafer processing sections; and applying in each of the plural single wafer processing sections a second processing following the first processing to the substrate transferred from the batch processing section.

To be more specific, in the first processing, a substrate having a resist film formed thereon is treated with a process gas containing an ozone gas and a water vapor so as to denature the resist film such that the denatured resist film is rendered soluble in water. Also, in the second processing, the resist film that has been denatured so as to be rendered soluble in water is washed with water and, thus, the denatured resist film is dissolved in water, thereby removing the resist film.

According to the substrate processing apparatus and the substrate processing method of the particular constructions described above, it is possible to make the apparatus itself compact while realizing a high through-put by the suitable combination of the batch processing section and the single wafer processing section. It follows that the processing cost can be reduced so as to lower the price of the manufactured article. It should also be noted that the substrate processing apparatus of the present invention can be installed in a small space so as to lessen the burden in respect of the transfer of the substrate processing apparatus from the manufacturing plant to the installing site and in respect of the installation of the substrate processing apparatus in the installing site. Further, in the substrate processing apparatus of the present invention, it is possible to suppress the number of batch processing sections and the number of single wafer processing sections that are to be arranged for providing the required processing capacity. It follows that the process control can be achieved easily in each process section so as to maintain a high processing quality of the substrate.

DETAILED DESCRIPTION OF THE INVENTION

An embodiment of the present invention will now be described in detail with reference to the accompanying drawings. The following description is directed to a resist-removing process system for removing a resist film from a semiconductor wafer having a resist film formed thereon, the resist film being cured by the ion implantation.

Figure 1:
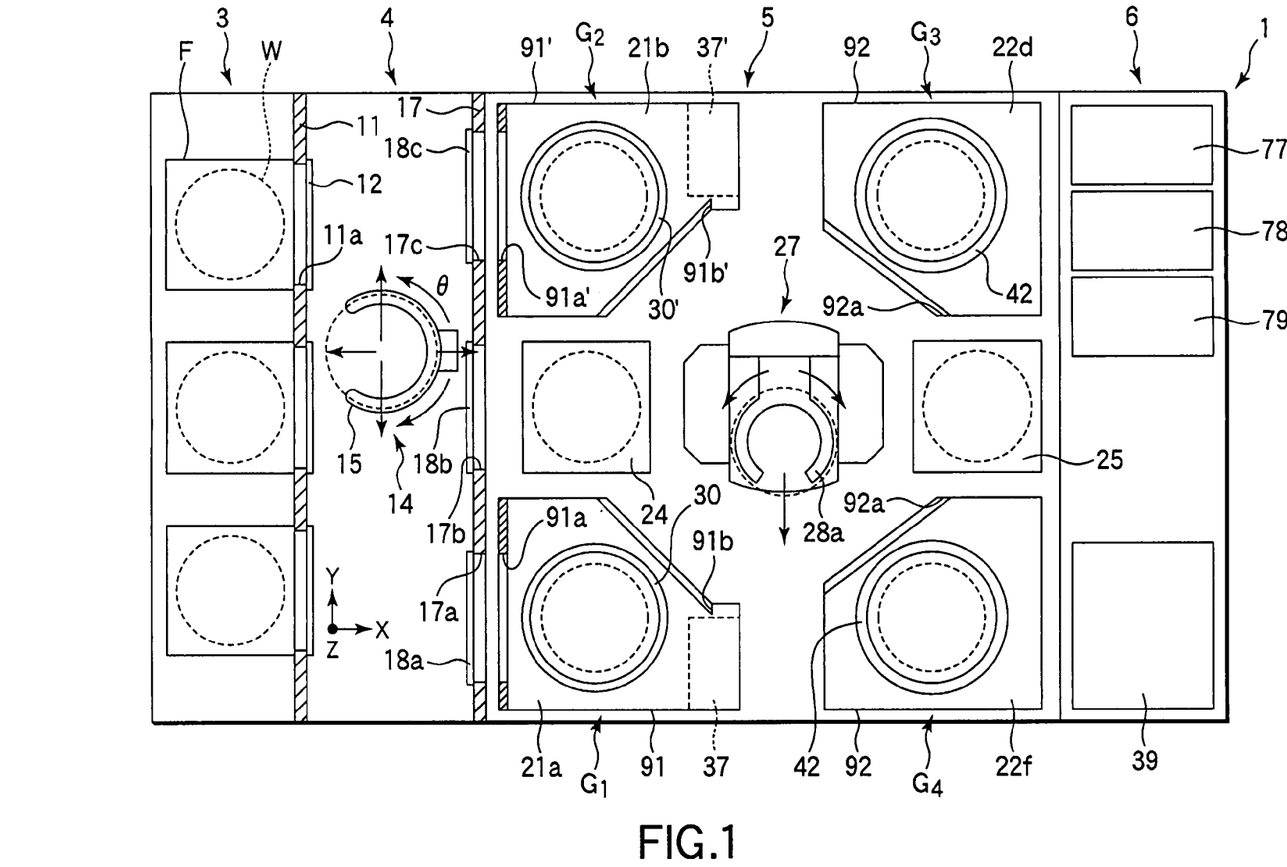
FIG. 1 is a horizontal cross sectional view schematically showing the construction of a resist-removing process system.
Figure 2:
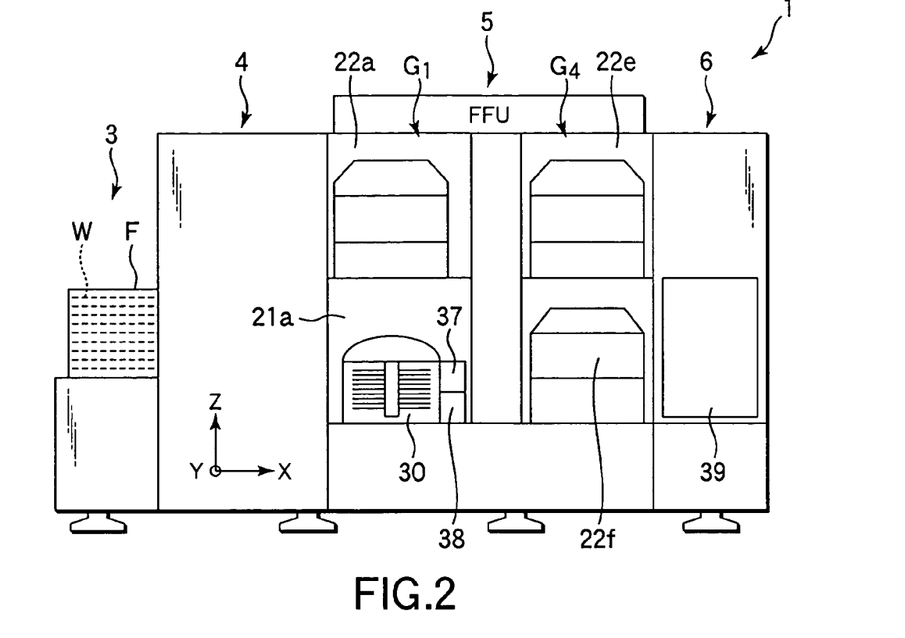
FIG. 2 is a side view schematically showing the construction of the resist-removing process system shown in FIG. 1.
Figure 3:
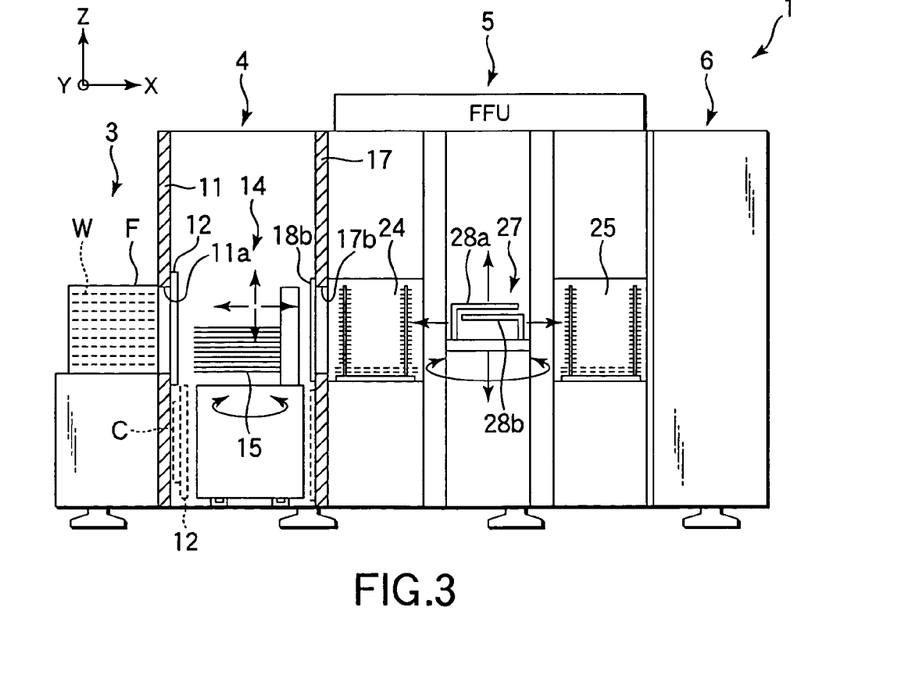
FIG. 3 is a vertical cross sectional view schematically showing the construction of the resist-removing process system shown in FIG. 1.

FIG. 1 is a horizontal cross sectional view schematically showing the construction of a resist-removing process system 1, FIG. 2 is a side view schematically showing the construction of the resist-removing process system 1 shown in FIG. 1, and FIG. 3 is a vertical cross sectional view schematically showing the construction of the resist-removing process system 1 shown in FIG. 1. As shown in the drawings, the resist-removing process system 1 comprises a FOUP (Front Opening Unified Pod) disposing section 3 on which the FOUP F housing wafers W is disposed, a wafer process section 5 for applying a series of different kinds of processing referred to herein later to the wafer W, a wafer transfer section 4 for transferring the wafer between the FOUP F disposed on the FOUP disposing section 3 and wafer process section 5, and a fluid supply section 6 for supplying various kinds of processing fluids used in the wafer process section 5.

It is possible for a plurality of wafers W, for example, 26 wafers W, to be housed in the FOUP F. The wafers W are housed in the FOUP F in a manner to assume a horizontal posture such that the wafers W are housed a prescribed distance apart from each other in the vertical direction (Z-direction). The wafers W are transferred into and out of the FOUP F through a transfer port formed in one side surface of the FOUP F. The transfer port noted above is opened or closed by a lid C shown in FIG. 3. The FOUP disposing section 3 is positioned on the front side of the resist-removing process system 1, and three FOUP's F can be disposed in the FOUP disposing section 3 side by side in the Y-direction. The FOUP F is disposed in the FOUP disposing section 3 such that one side surface of the FOUP F having the wafer transfer port formed therein is in direct contact with an opening 11a in a wall 11 acting as a partitioning wall between the FOUP disposing section 3 and the wafer transfer section 4.

The opening 11a can be opened or closed by a shutter 12 that can be moved by a driving mechanism (not shown). A mechanism (not shown) for operating the lid C of the FOUP F is mounted to the shutter 12. The shutter 12 and the lid C of the FOUP F can be moved integrally by operating the particular mechanism. By contraries, under the state that the FOUP F is not disposed in the FOUP disposing section 3, the shutter 12 is interlocked with the opening 11a so as to prevent the opening 11a from being opened.

A first wafer transfer mechanism 14 is arranged in the wafer transfer section 4. The first wafer transfer mechanism 14 comprises a comb-shaped arm 15 formed of, for example, 13 arms that are arranged apart from each other in the Z-direction such that the vertical distance of the clearance between the adjacent arms is in conformity with the vertical distance between the adjacent wafers housed in the FOUP F so as to transfer simultaneously the 13 wafers housed in the FOUP F. The number of wafers W that can be transferred simultaneously from within the FOUP F is not limited to 13.

The first wafer transfer mechanism 14 can be moved in the Y-direction by a driving mechanism (not shown) and can be swung in the θ-direction, i.e., swingable within a horizontal plane. Also, the comb-shaped arm 15 can be elongated in the X-direction and is movable in the Z-direction by a driving mechanism (not shown). Because of the particular construction, the comb-shaped arm 15 is capable of gaining access to an arbitrary FOUP F so as to take the wafers W out of the FOUP F for transfer of the wafers W to any of resist-denaturing process units 21a and 21b arranged in the wafer process section 5. By contraries, the comb-shaped arm 15 is also capable of taking the wafers W out of a first wafer disposing section 24 arranged within the wafer process section 5 so as to permit the wafers W to be housed in an arbitrary FOUP F.

The wall 17 is formed between the wafer transfer section 4 and the wafer process section 5. Wafer transfer ports 17a, 17b and 17c are formed in three portions of the wall 17. These wafer transfer ports 17a, 17b, 17c can be opened or closed by shutters 18a, 18b and 18c that can be moved by driving mechanisms (not shown).

The wafer process section 5 comprises a first process section $G_1$ and a second process section $G_2$. The first process section $G_1$ includes a resist-denaturing process unit 21a arranged in the lower stage and a water-wash process unit 22a arranged on the resist-denaturing process unit 21a.

In the resist-denaturing process unit 21a, the wafer W is treated with a process gas containing an ozone gas and a water vapor, i.e., a denaturing process gas, so as to denature the resist formed on the wafer W such that the resist film is rendered soluble in water. Also, in the water-wash process unit 22a, the wafer W treated in the resist-denaturing process unit 21a is washed with water so as to remove the resist film that has been made soluble in water.

The second process section $G_2$ is equal in construction to the first process section $G_1$ and, thus, comprises a resist-denaturing process unit 21b arranged in the lower stage and a water-wash process unit 22b arranged on the resist-denaturing process unit 21b. Incidentally, the water-wash process unit 22b does not come into view in FIGS. 1 to 3 and, thus, is not shown in the drawings.

The wafer process section 5 also includes a third process section $G_3$ formed of water-wash process units 22c and 22d having the same construction and arranged one upon the other so as to form a two stage structure, and a fourth process section $G_4$ formed of water-wash process units 22e and 22f having the same construction and arranged one upon the other so as to form a two stage structure. Incidentally, the water-wash process unit 22c does not come into view in FIGS. 1 to 3 and, thus, is not shown in the drawings.

The wafer process section 5 further comprises the first wafer disposing section 24 for disposing thereon the wafers W after the processing in the water-wash process units 22a to 22f for bringing these wafers W back to the wafer transfer section 4, a second wafer disposing section 25 for temporarily disposing thereon the wafers W, and a second wafer transfer mechanism 27 for transferring the wafer W among each of the process units included in the first process section $G_1$ to the fourth process section $G_4$, the first wafer disposing section 24 and the second wafer disposing section 25.

A fan filter unit (FFU) for supplying a clean down flow of the air to each of the process units and devices mounted in the wafer process section 5 is arranged in an upper portion of the wafer process section 5.

The resist-denaturing process unit 21a arranged within the first process section $G_1$ is constructed to include a process chamber 30, a water vapor generator 38, and a mixer 37 for mixing the water vapor generated in the water vapor generator 38 with an ozone gas generated from an ozone gas generator 39 that is arranged in the fluid supply section 6. The process chamber 30, the water vapor generator 38 and the mixer 37 are arranged within a housing 91.

As shown in FIG. 1, a wafer inlet port 91a that can be opened or closed by a shutter (not shown) is formed in that portion of the housing 91 which is positioned to face the wafer transfer port 17a formed in the wall 17. Also, a wafer outlet port 91b that can be opened or closed by a shutter (not shown) is formed in a prescribed position of that portion of the wall of the housing 91 which is positioned to face the second wafer transfer mechanism 27.

The 13 wafers W taken out of a prescribed FOUP F by the first wafer transfer mechanism 14 are collectively transferred into the resist-denaturing process unit 21a through the wafer transfer port 17a and the wafer inlet port 91a. As described herein later, the second wafer transfer mechanism 27 comprises two single-wafer arms 28a and 28b for transferring the wafers W one by one. The wafers W after the processing in the resist-denaturing process unit 21a are taken out one by one by the single-wafer arms 28a and 28b from the resist-denaturing process unit 21a.

As described above, the wafer inlet port 91a and the wafer outlet port 91b are formed in different positions in the resist-denaturing process unit 21a. Because of the particular construction, it is possible to transfer the wafers W housed in the FOUP F directly into the resist-denaturing process unit 21a and, then, to transfer the wafers W after the processing in the resist-denaturing process unit 21a to the water-wash process unit 22 without bringing the wafers W after the processing in the resist-denaturing process unit 21a back to the wafer transfer section 4. It follows that it is possible to shorten the time required for transferring the wafer W so as to increase the through-put. Also, since the resist-denaturing process unit 21a is utilized as a relaying point for the transfer of the wafer W between the first wafer transfer mechanism 14 and the second wafer transfer mechanism 27, it is possible to diminish the footprint of the resist-removing process system 1.

Figure 4:
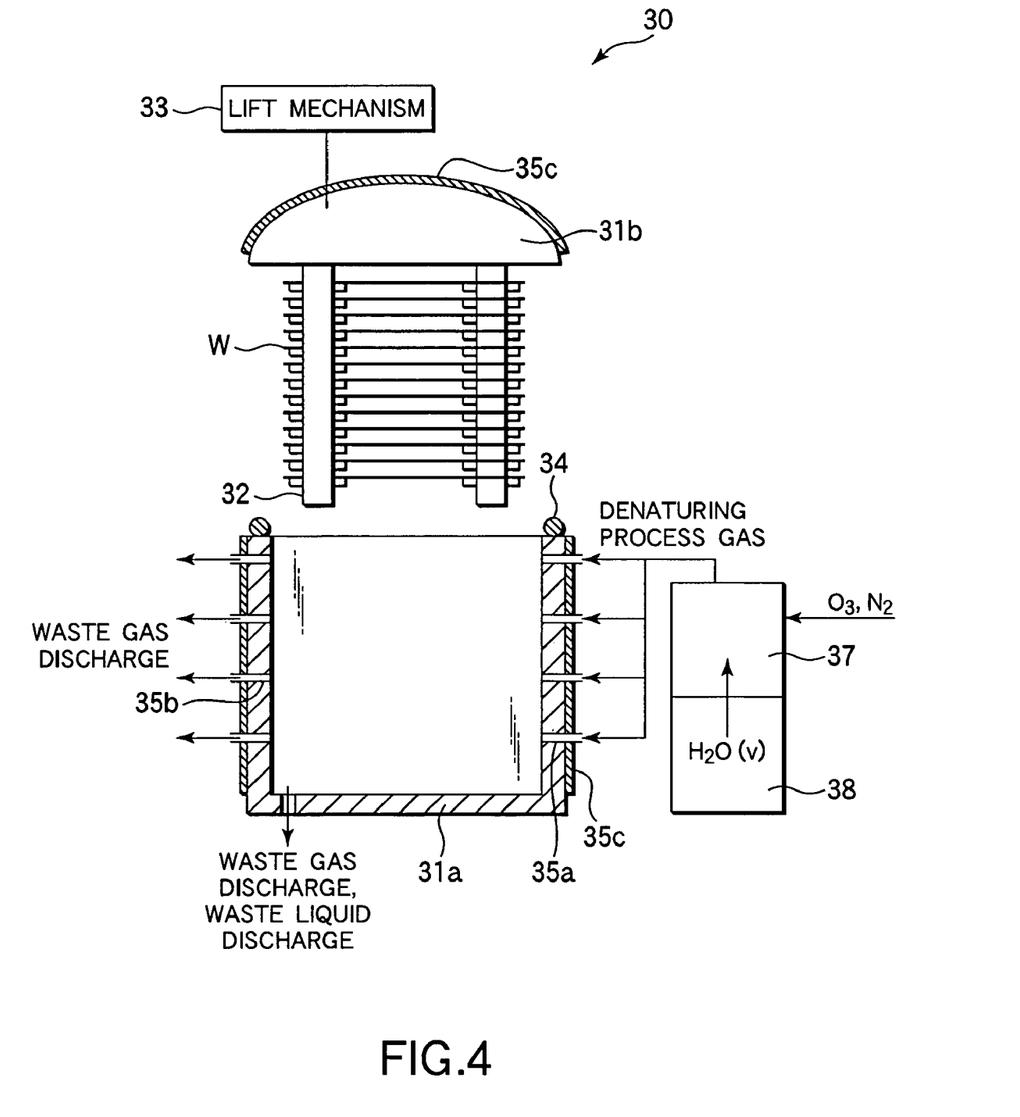
FIG. 4 schematically shows the construction of a process chamber.

FIG. 4 schematically shows the construction of the process chamber 30. As shown in the drawing, the process chamber 30 comprises a container 31a having an open upper portion, a container cover 31b closing the upper open surface of the container 31a, and a holding member 32 for holding the wafers W in substantially a horizontal posture such that the wafers W are held a prescribed distance apart from each other in the vertical direction. The container cover 31b and the holding member 32 can be integrally moved in the vertical direction by a lift mechanism 33, and a seal ring 34 is formed on the upper surface of the container 31a.

A denaturing process gas flows substantially horizontally within the process chamber 30. It should be noted that gas supply nozzles 35a for supplying the denaturing process gas into the process chamber 30 and exhaust nozzles 35b for exhausting the process chamber 30 are formed in the side walls of the container 31a. Because of the particular construction, the denaturing process gas is efficiently and uniformly supplied to each surface of the wafers W held by the holding member 32.

A heater 35c is formed in each of the container 31a and the container cover 31b. The temperature within the process chamber 30 is maintained constant by operating the heater 35c so as to prevent substantially the process conditions from being changed. Also, the water vapor contained in the denaturing process gas is prevented from forming dew within the process chamber 30 by operating the heater 35c.

The water vapor generator 38 arranged within the resist-denaturing process unit 21a supplies the water vapor ($H_2O$ (v)) into the mixer 37 alone, the mixer 37 being arranged within the resist-denaturing process unit 21a together with the water vapor generator 38. In the mixer 37, the ozone gas supplied from the ozone generator 39 is mixed with the water vapor supplied from the water vapor generator 38 so as to prepare the denaturing process gas. The denaturing process gas thus prepared is supplied into the process chamber 30. Because of the particular construction described above, the length of the pipe extending between the water vapor generator 38 and the process chamber 30 can be decreased in the resist-denaturing process unit 21a so as to alleviate the burden for keeping the pipe warm. Further, since the length of the pipe noted above is decreased, the dew formation within the pipe can be suppressed so as to make it possible to supply the water vapor into the mixer 37 with a high stability. Incidentally, it is possible to mix the water vapor with the ozone gas within the gas supply nozzle 35a without arranging the mixer 37.

The construction of the resist-denaturing process unit 21b arranged within the second process section $G_2$ is in symmetry with the construction of the resist-denaturing process unit 21a with respect to the X-axis. Also, the resist-denaturing process unit 21b is equal to the resist-denaturing process unit 21a in function and use. To be more specific, the resist-denaturing process unit 21b is constructed to include a process chamber 30', a water vapor generator 38', and a mixer 37', which are arranged within a housing 91'. Incidentally, the water vapor generator 38' does not come into view in FIGS. 1 to 3 and, thus, is not shown in the drawings.

A wafer inlet port 91a' is formed in that portion of the housing 91' which is positioned to face the wafer transfer port 17c, and a wafer outlet port 91b' is formed in the wall of that portion of the housing 91' which is positioned to face the second wafer transfer mechanism 27. The construction of the process chamber 30' is equal to that of the process chamber 30 and, thus, the description thereof is omitted. The water vapor generator 38' (not shown) supplies the water vapor to the mixer 37' alone, and an ozone gas is supplied from the ozone gas generator 39 into the mixer 37' so as to prepare the denaturing process gas. The denaturing process gas prepared in the mixer 37' is supplied into the process chamber 30' alone.

In the wafer process section 5, the resist-denaturing process units 21a and 21b are provided with the water vapor generators 38 and 38', with the result that the process conditions for each of the resist-denaturing process units 21a and 21b can be set easily.

The construction of the water-wash process unit 22a arranged within the first process section $G_1$ is in symmetry with the construction of the water-wash process unit 22b (not shown) arranged within the second process section $G_2$ with respect to the X-axis. Likewise, the construction of the water-wash process unit 22a is in symmetry with the construction of the water-wash process unit 22e with respect to the Y-axis. Also, the construction of the water-wash process unit 22b (not shown) is in symmetry with the construction of the water-wash process unit 22c with respect to the Y-axis. Further, the construction of the water-wash process unit 22c is in symmetry with the construction of the water-wash process unit 22e with respect to the X-axis.

Figure 5:
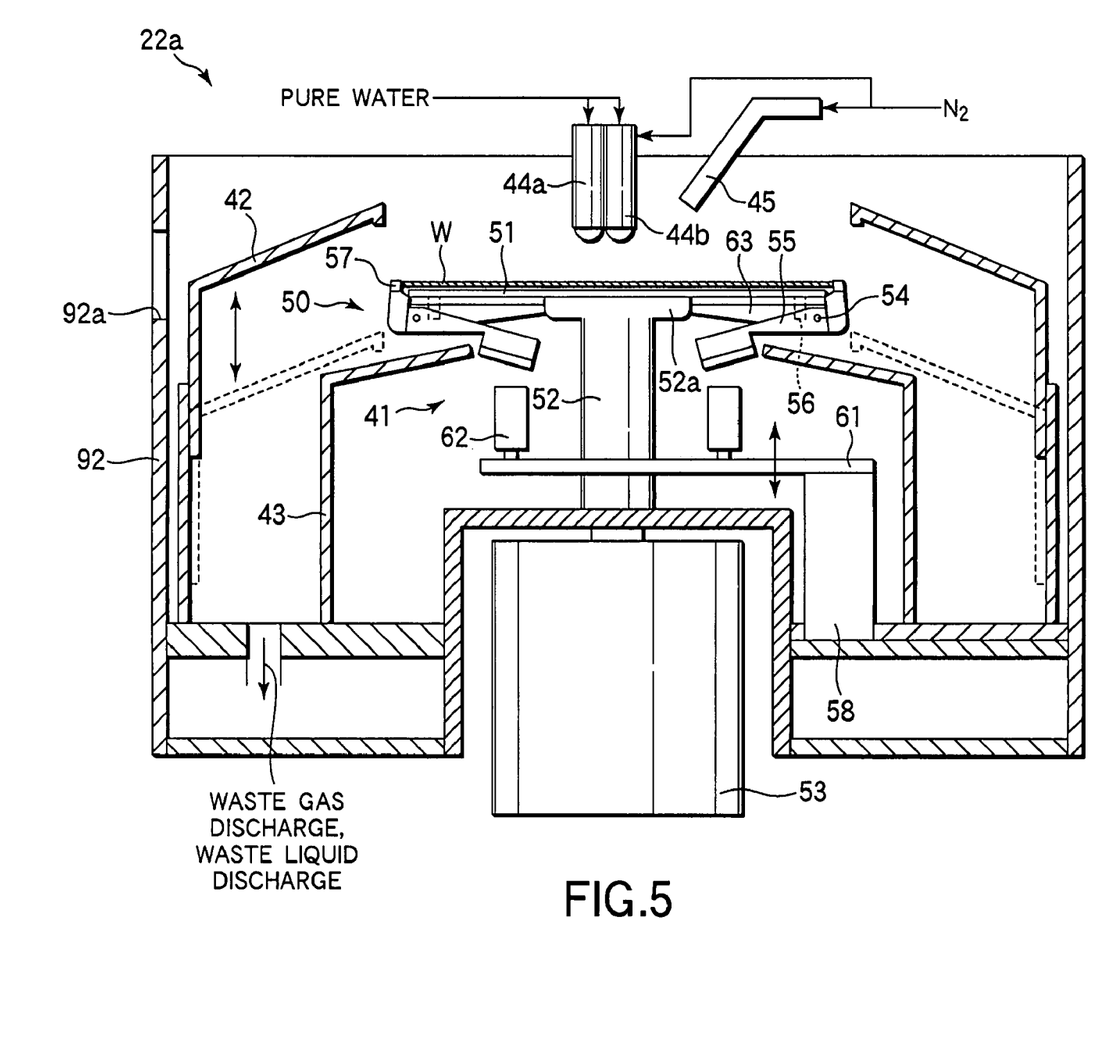
FIG. 5 is a cross sectional view schematically showing the construction of a water-wash process unit.

FIG. 5 is a cross sectional view schematically showing the construction of the water-wash process unit 22a. As shown in the drawing, the water-wash process unit 22a comprises a housing 92. Arranged within the housing 92 are a spin chuck 41 for holding the wafer W in substantially the horizontal posture, an outer cup 42 arranged to surround the wafer W held by the spin chuck 41, and an inner cup 43 arranged below the wafer W held by the spin chuck 41.

The outer cup 42 can be moved in the vertical direction by a lift mechanism (not shown) between the position denoted by the solid line and the position denoted by a dotted line in FIG. 5. The transfer of the wafer W into the water-wash process unit 22a and the transfer of the wafer W out of the water-wash process unit 22a are performed through an opening 92a formed in that portion of the wall of the housing 92 which is positioned to face the second wafer transfer mechanism 27. The opening 92a can be opened or closed by a shutter (not shown).

The spin chuck 41 comprises a rotating stage 51, a holding mechanism 50 mounted to the rotating stage 51 for mechanically holding the wafer W at the edge surface, a pivotal shaft 52 supporting the rotating stage 51, and a motor 53 for rotating the pivotal shaft 52. A plurality of support pins (not shown) for supporting the wafer W are mounted to the circumferential peripheral portion of the rotating stage 51. On the other hand, the holding mechanism 50 comprises three arms 63 mounted to extend in the radial direction from a disk-like flange section 52a formed in an upper portion of the pivotal shaft 52, a pivotal shaft member 54 mounted to the tip of each arm 63, a substantially L-shaped link member 55 rotatably pivoted to the pivotal shaft member 54, a spring 56 mounted to the arm 63 and urging downward the link member 55, and a claw member 57 mounted to the tip on the upper side of the link member 55.

A support member 61 is arranged to surround a part of the pivotal shaft 52, and three columnar projecting members 62

(two projecting member 62 alone being shown in FIG. 5) are mounted to the support member 61. The support member 61 can be moved in the vertical direction by an air cylinder 58. Under the state that the support member 61 is held in the lower position, i.e., under the state that the projecting member 62 and the link member 55 are positioned apart from each other, the link member 55 is urged by the spring 56 such that the claw member 57 is pushed toward the center of the rotating stage 51, with the result that the edge surface of the wafer W is held by the force received from the claw member 57. On the other hand, if the support member 61 is moved upward so as to permit the link member 55 to be pushed by the projecting member 62, the pivotal shaft member 54 is swung by the link member 55 in a manner to permit the claw member 57 to be opened outward, with the result that the wafer W is held open.

The water-wash process unit 22a also comprises a pure water supply nozzle 44a for supplying a pure water (DIW; deionized water) used as a washing solution to the wafer W held by the spin chuck 41, a pneumatic spray nozzle 44b for converting the pure water into mist by using a nitrogen gas ($N_2$), the resultant mist being spurted against the wafer W held by the spin chuck 41, and a gas nozzle 45 for spurting a nitrogen gas used as a drying gas.

It is possible to dispose the 13 wafers W after the processing in any of the water-wash process units 22a to 22f on the first wafer disposing section 24. These wafers W are disposed equidistantly in the Z-direction on the first wafer disposing section 24. The first wafer transfer mechanism 14 collectively transfers the 13 wafers W disposed on the first wafer disposing section 24 out of the wafer process section 5.

The wafers W after the processing in any of, for example, the resist-denaturing process units 21a and 21b are temporarily disposed on the second wafer disposing section 25 in the case where it is impossible to transfer the wafers W noted above into any of the water-wash process units 22a to 22f because all of these water-wash process units 22a to 22f are under operation.

The second wafer transfer mechanism 27 includes two single-wafer arms 28a and 28b serving to transfer the wafers W one by one. The second wafer transfer mechanism 27 is swingable about the Z-axis. Also, the two single-wafer arms 28a and 28b can be moved in the vertical direction by a lift mechanism and can be moved in the horizontal direction by a shrinking mechanism. Because of the particular construction, each of the single-wafer arms 28a and 28b is capable of gaining access to each of the process units included in the first process sections $G_1$ to the fourth process section $G_4$, to the first wafer disposing section 24, and to the second wafer disposing section 25 so as to transfer the wafer W among these sections. For example, it is possible to use the single-wafer arm 28a for transferring the wafers W after the processing in the resist-denaturing process units 21a and 21b, and to use the single-wafer arm 28b for transferring the wafers W after the processing in the water-wash process units 22a to 22f. By using the single-wafer arms 28a and 28b in this fashion, it is possible to prevent the single-wafer arms 28a and 28b from being contaminated and to prevent the wafer W from being contaminated by the contamination of the single-wafer arms 28a, 28b.

Arranged in the fluid supply section 6 are an ozone generator 39 for generating an ozone gas ($O_3$) used in the resist-denaturing process units 21a, 21b, an oxygen supply section 77 for supplying a pure oxygen gas ($O_2$) into the ozone generator 39, a pure water supply section 78 for supplying a pure water into the water-wash process units 22a to 22f and to the water vapor generator 38, and a nitrogen supply section 79 for supplying a nitrogen gas into the resist-denaturing process units 21a, 21b and into the water-wash process units 22a to 22f.

Figure 6:
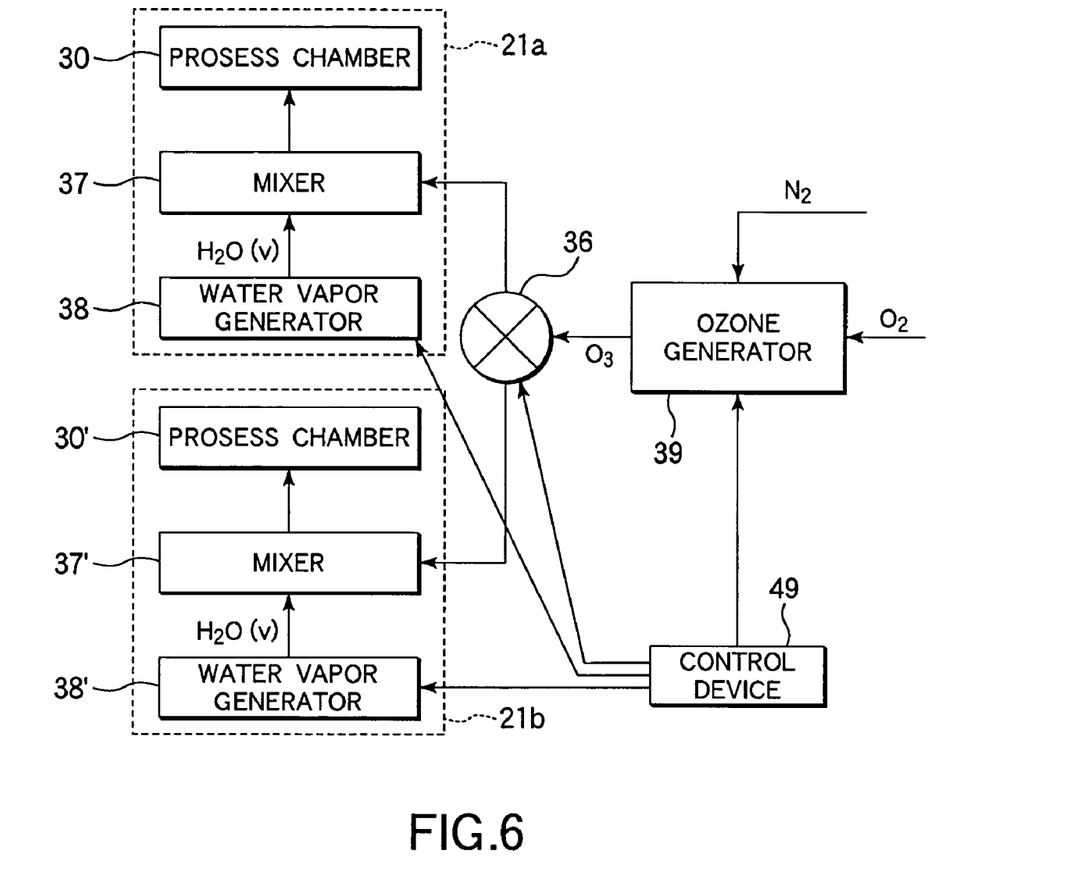
FIG. 6 schematically shows the supply mode of an ozone gas into the resist-denaturing process unit.

FIG. 6 schematically shows the supply mode of an ozone gas from the ozone generator 39 into the resist-denaturing process units 21a, 21b. An oxygen gas is supplied from a pure oxygen supply line into the ozone generator 39, and a prescribed amount of the oxygen gas is converted into an ozone gas within the ozone generator 39. The ozone gas formed within the ozone generator 39 is diluted with the nitrogen gas supplied from the nitrogen supply section 79 and, then, transferred into any of the mixers 37 and 37' by switching appropriately a switching valve 36. In this fashion, the ozone gas is not supplied simultaneously from the ozone generator 39 into the resist-denaturing process units 21a and 21b included in the first process section $G_1$ and the second process section $G_2$, respectively.

The operation of each of the ozone generator 39 and the switching valve 36 is controlled by a control device 49. In addition, the control device 49 also permits operating only one water vapor generating device which is connected to one of the mixers to which the ozone gas is supplied. Incidentally, it is also possible to supply a mixed gas consisting of the air, a pure oxygen gas, and a nitrogen gas, which are mixed at a prescribed mixing ratio, into the ozone generator 39 so as to permit the oxygen gas contained in the mixed gas to be converted into an ozone gas.

It is possible to mount a system control device and performing the overall control of the various devices and the driving mechanism included in the resist-removing process system 1 constructed as described above in, for example, the free space below the stage for supporting the FOUP F. On the other hand, it is also possible to construct the particular system control device separately from the resist-removing process system 1 so as to be connected to a prescribed position of the resist-removing process system 1.

The process step of the wafers W, which is carried out by the resist moving process system 1, will now be described. In the first step, the FOUP F having wafers W housed therein is disposed on the FOUP disposing section 3. A resist film cured by the ion implantation is formed on the surface of each of the wafers W housed in the FOUP F. Then, the lid C of the FOUP F is moved together with the shutter 12 so as to open the opening 11a, followed by moving the comb-shaped arm 15 into the FOUP F so as to transfer collectively the 13 wafers W out of the FOUP F.

In the next step, the comb-shaped arm 15 holding the transferred wafers W is allowed to be positioned to face the wafer transfer port 17a. Also, the shutter 18a is driven so as to open the wafer transfer port 17a and, then, the wafer transfer port 91a formed in the housing 91 of the resist-denaturing process unit 21a arranged in the first process section $G_1$ is opened. Further, the container cover 31b and the holding member 32 in the process chamber 30 are moved upward in the resist-denaturing process unit 21a. Then, the comb-shaped arm 15 is moved into the resist-denaturing process unit 21a so as to transfer the wafers W held by the comb-shaped arm 15 from the comb-shaped arm 15 into the holding member 32.

After the wafers W are held by the holding member 32, the comb-shaped arm 15 is retreated from within the resist-denaturing process unit 21a, followed by closing the wafer transfer port 17a. Also, in the resist-denaturing process unit 21a, the wafer inlet port 91a is closed and the holding member 32 and the container cover 31b are moved downward so as to hermetically close the process chamber 30.

Under this condition, the heaters 35c mounted to the container 31a and the container cover 31b are operated so as to maintain the inner space of the process chamber 30 at a prescribed temperature. Then, an ozone gas is generated from the ozone generator 39, and a water vapor is generated from the water vapor generator 38 so as to prepare a denaturing process gas within the mixer 37. The denaturing process gas thus prepared is supplied into the process chamber 30. As a result, the resist film formed on the wafer W housed in the process chamber 30 is denatured so as to be rendered soluble in water.

While the denaturing processing of the resist film formed on the wafer W is being carried out in the resist-denaturing process unit 21a included in the first process section $G_1$, the first wafer transfer mechanism 14 transfers the 13 wafers W remaining in the FOUP F into the resist-denaturing process unit 21b arranged in the second process section $G_2$ by a method equal to the method described above.

After completion of the processing in the resist-denaturing process unit 21a, the supply of the denaturing process gas into the process chamber 30 included in the resist-denaturing process unit 21a is stopped, followed by purging the inner space of the process chamber 30 with a nitrogen gas so as to discharge completely the ozone gas from within the process chamber 30. Then, the container cover 31b and the holding member 32 are moved upward with the inner pressure of the process chamber 30 set to conform with the outer pressure. Further, the outlet port 91b of the resist-denaturing process unit 21a is opened so as to take out the wafers W held by the holding member 32 one by one by using the single-wafer arm 28a of the second wafer transfer mechanism 27. The wafers W thus taken out are transferred into any of the water-wash process units 22a to 22f, which is vacant.

In the water-wash process units 22a to 22f, a prescribed amount of the pure water is spurted from the pure water supply nozzle 44a while rotating the wafer W so as to remove the resist film, which has been rendered soluble in water, from the wafer W. Then, a pure water mist is spurted from the pneumatic spray nozzle 44a against the wafer W under the state that a film of a pure water is formed on the wafer W so as to remove the particles from the wafer W. Further, a pure water is supplied again from the pure water supply nozzle 44a onto the wafer W so as to apply a rinsing treatment to the wafer W, followed by rotating the wafer W at a high rotating speed for drying the wafer W. It is possible to increase the through-put by operating simultaneously a plurality of the water-wash process units selected from the water-wash process units 22a to 22f.

Where all of the water-wash process units 22a to 22f are under operation, the wafer W having the resist film, which is formed on the wafer W, subjected to the denaturing processing within the resist-denaturing process unit 21a is retained within the resist-denaturing process unit 21a until any of the water-wash process units 22a to 22f is rendered vacant. Alternatively, the particular wafer W noted above is once transferred into the second wafer disposing section 25 and, then, further transferred into a vacant water-wash process unit so as to be subjected to the water-wash processing.

The wafers W after the processing in the water-wash process units 22a to 22f are successively transferred into the first wafer disposing section 24. Then, the next wafer W to be processed are introduced into the vacant water-wash process unit out of which the wafers W have been transferred, the water-wash process unit being selected from among the water-wash process units 22a to 22f, so as to apply the water-wash processing to the wafers W introduced into the vacant water-wash process unit. After the 13 wafers W are aligned in the first wafer disposing section 24, the shutter 18b is moved so as to open the wafer transfer port 17b. Then, the comb-shaped arm 15 arranged in the first wafer transfer mechanism 14 is allowed to gain access to the first wafer disposing section 24 so as to take collectively the 13 wafers W out of the first wafer disposing section 24. The 13 wafers W thus taken out are transferred into the FOUP F.

At the time when the processing in the resist-denaturing process unit 21a has been finished, the 13 wafers W have already been transferred into the resist-denaturing process unit 21b. Such being the situation, the denaturing processing of the resist film formed on the wafer W transferred from the FOUP F into the resist-denaturing process unit 21b is applied in the resist-denaturing process unit 21b by a method equal to that employed in the resist-denaturing process unit 21a. In this fashion, the wafers W are alternately processed in the resist-denaturing process unit 21a and the resist-denaturing process unit 21b.

In the resist-removing process system 1, the wafers W are not processed simultaneously in the resist-denaturing process unit 21a included in the first process section $G_1$ and in the resist-denaturing process unit 21b included in the second process section $G_2$, with the result that it is possible to set constant the ozone gas generating amount in the ozone generator 39. It follows that the ozone generator 39 can be controlled easily. Also, since it is unnecessary to generate a large amount of the ozone gas, it is possible to use a small apparatus as the ozone generator 39 so as to suppress the apparatus cost to a low level.

The wafers W after the processing in the resist-denaturing process unit 21b included in the second process section $G_2$ are successively transferred into a vacant water-wash process unit selected from the water-wash process units 22a to 22f so as to apply the water-wash processing to the transferred wafers W. Where a vacant water-wash process unit is not included in the water-wash process units 22a to 22f, the wafers W after the processing in the resist-denaturing process unit 21b included in the second process section $G_2$ are retained in the resist-denaturing process unit 21b until some of the water-wash process units are rendered vacant. Alternatively, the wafers W noted above are once transferred into the second wafer disposing section 25 and, then, transferred successively from the second wafer disposing section 25 into the vacant water-wash process unit as soon as any of the water-wash process units 22a to 22f is rendered vacant. The wafers W after the water-wash processing are transferred into the first wafer disposing section 24 and, then, further transferred collectively into the FOUP F. The FOUP F having the wafers W housed therein after the processing for removing the resist film is transferred into an apparatus in which the succeeding manufacturing process is to be carried out.

For example, in the resist-removing process system 1 described above, the transfer efficiency and the processing efficiency of the wafers W can be improved in the case where, particularly, the time required for collectively processing the 13 wafers W in each of the resist-denaturing process units 21a and 21b is substantially equal to the time required for processing the 13 wafers W by using the six water-wash process units 22a to 22f. In this fashion, the through-put of the entire system is not lowered in the resist-removing process system 1 even if the batch process units and the single wafer process units are included together in the resist-removing process system 1. To be more specific, the through-put of the entire system is not lowered if the processing requiring a long processing time is carried out by using the batch process unit and the processing that does not require a long processing time is carried out by using the single wafer process unit. In addition, the inclusion of the batch process unit in the resist-removing process system 1 serves to promote the miniaturization of the entire system.

Where the second FOUP F is disposed on the FOUP disposing section 3, the wafers W are transferred from the second FOUP F into the resist-denaturing process unit 21*a* included in the first process section $G_1$ while the denaturing processing of the resist film is being carried out in the resist-denaturing process unit 21*b* included in the second process section $G_2$. The wafers W are processed in the resist-denaturing process unit 21*a* after completion of the processing of the wafers W in the resist-denaturing process unit 21*b* included in the second process section $G_2$. The procedures described above are repeated in the subsequent steps so as to process the wafers W housed in the FOUP F transferred onto the FOUP disposing section 3.

The present invention is not limited to the embodiment described above. For example, in the embodiment described above, the resist-removing process system 1 includes two resist-denaturing process units and six water-wash process units. However, the number of process units and the ratio of the number of resist-denaturing process units to the number of water-wash process units are not limited to those in the embodiment described above. It is possible to determine appropriately the number of process units included in the resist-removing process system 1 in view of the processing capacity of the entire system and the through-put of each of the process units. For example, it is possible for the resist-removing process system 1 to include a single resist-denaturing process unit and a plurality of water-wash process units. In order to increase the through-put of the resist-removing process system 1, it is desirable to determine the ratio of the number of resist-denaturing process units to the number of water-wash process units in a manner to increase the operating rate in the water-wash process units.

Also, it is possible to construct the comb-shaped arm 15 included in the first wafer transfer mechanism 14 such that the 26 wafers housed in the FOUP F can be collectively transferred by the comb-shaped arm 15, and to construct the resist-denaturing process units 21*a* and 21*b* so as to be capable of collectively processing the 26 wafers. Further, it is desirable to construct the water-wash process unit so as to be capable of performing a so-called "SC-1 washing processing" utilizing an APM chemical liquid prepared by mixing an ammonia water with a hydrogen peroxide solution.

The substrate to be processed is not limited to semiconductor wafers. It is also possible for the substrate processing apparatus of the present invention to process, for example, a glass substrate for a liquid crystal display and various ceramic substrates.

In the embodiment described above, the batch processing is performed first, followed by performing the single wafer processing. However, where the processing performed first requires a short processing time and the processing performed later requires a long processing time in the case of performing a series of different kinds of processing, it is desirable to construct the system such that the single wafer processing is performed first, followed by performing the batch processing. In this case, the wafers W housed in the FOUP F are taken out one by one and, then, transferred directly into the plural single wafer process units so as to carry out the prescribed processing in the single wafer process units. Then, the wafers W after the processing in the single wafer process units are transferred one by one into the batch process unit. The processing in the batch process unit is started after a prescribed number of wafers W are transferred into the batch process unit. Further, the wafers W after the prescribed processing in the batch process unit are transferred one by one out of the batch process unit so as to be housed in the FOUP F.

It should be noted that the embodiments described above are simply intended to clarify the technical idea of the present invention. Naturally, the technical scope of the present invention should not be construed solely on the basis of the specific embodiment described above. In other words, the present invention can be worked in variously modified fashions on the basis of the spirit of the present invention and within the scope defined in the accompanying claims.

What is claimed is:

1. A substrate processing apparatus for applying a prescribed processing to a substrate, said apparatus comprising:
    a container disposing section on which a container capable of housing a plurality of substrates is disposed;
    a batch processing section for applying a first processing to a plurality of substrates;
    a single substrate processing section for applying a second processing to a single substrate;
    a substrate supporting section, juxtaposed by the batch processing section, for supporting a plurality of substrates:
    a single substrate transfer mechanism for transferring substrates one by one between the batch processing section and the single substrate processing section, such that the first processing performed in the batch processing section and the second processing performed in the single substrate processing section are sequentially performed in this order; and
    a batch substrate transfer mechanism for transferring simultaneously a plurality of substrates from the container disposing section to the batch processing section, and transferring simultaneously a plurality of substrates from the substrate supporting section to the container disposing section,
    wherein the batch processing section has a structure arranged to perform as the first processing a processing for substrates newly loaded into the apparatus, prior to the second processing in the single substrate processing section, and
    the substrate supporting section has a structure different from the batch processing section and arranged to temporarily store substrates transferred by the single substrate transfer mechanism one by one, after the second processing in the single-substrate processing section.

2. The substrate processing apparatus according to claim 1, wherein the number of single substrate processing sections is larger than the number of batch processing sections.

3. The substrate processing apparatus according to claim 1, wherein the single substrate transfer mechanism and the batch substrate transfer mechanism are configured to gain access to the batch processing section in different directions.

4. The substrate processing apparatus according to claim 1, wherein the apparatus comprises a plurality of single substrate processing sections.

5. The substrate processing apparatus according to claim 4, wherein at least two of the single substrate processing sections are used simultaneously.

6. The substrate processing apparatus according to claim 1, wherein the apparatus comprises a plurality of batch processing sections.

7. The substrate processing apparatus according to claim 6, wherein the operation of the plural batch processing sections is switched such that the operation of a certain batch processing section is switched to the operation of another batch processing section after the operation of said certain batch processing section is finished.

8. The substrate processing apparatus according to claim 1, wherein the number of substrates that can be transferred simultaneously by the batch substrate transfer mechanism is determined in accordance with the tact time of the processing in each of the batch processing section and the single substrate processing section such that the processing in the batch processing section and the processing in the single substrate processing section can be consecutively carried out smoothly.

9. The substrate processing apparatus according to claim 1, wherein a resist film formed on substrates is processed in the batch processing section with a process gas containing an ozone gas and a water vapor so as to denature the resist film such that the resist film is rendered soluble in water, and the water-wash treatment for removing the resist film, which has been denatured so as to be soluble in water, is carried out in the single substrate processing section.

10. The substrate processing apparatus according to claim 9, wherein the apparatus comprises a plurality of batch processing sections, and an ozone supply source in which the ozone supply is controlled to permit the ozone gas to be supplied into only some of the batch processing sections that are selected from the plural batch processing sections, and wherein each of the plural batch processing sections further comprises a water vapor supply source for generating the water vapor.

11. A substrate processing system comprising a container disposing area, a first transfer area, a first processing area, a second transfer area, and a second processing area arrayed in this order in a first direction, wherein:
  the container disposing area includes a container disposing member configured to set a container for storing a plurality of substrates such that an I/O port of the container faces the first transfer area;
  the first transfer area includes a batch transfer unit configured to transfer a plurality of substrates all together, the batch transfer unit being movable in a second direction perpendicular to the first direction and rotatable to select an access target, and the batch transfer unit being configured to transfer a plurality of substrates all together to and from the container through the I/O port of the container;
  the second transfer area includes a single substrate transfer unit configured to transfer substrates one by one, the single substrate transfer unit being rotatable to select an access target;
  the first processing area includes first and second batch processing units arrayed in the second direction and each configured to process a plurality of substrates all together, each of the first and second batch processing units having an inlet port oriented in parallel to the second direction to face a traveling route of the batch transfer unit and configured for the batch transfer unit to load a plurality of substrates all together therethrough, and each of the first and second batch processing units having an outlet port oriented with an inclination relative to the first and second directions to face a central portion of the single substrate transfer unit and configured for the single substrate transfer unit to unload substrates one by one therethrough;
  the first processing area further includes a first substrate supporting section interposed between the first and second batch processing units in the second direction and configured to support a plurality of substrates at intervals in a vertical direction, the first substrate supporting section having an outlet port oriented in parallel to the second direction to face the traveling route of the batch transfer unit and configured for the batch transfer unit to unload a plurality of substrates all together therethrough, and the first substrate supporting section having an inlet port facing the central portion of the single substrate transfer unit and configured for the single substrate unit to load substrates one by one therethrough;
  the second processing area includes first and second single substrate processing units arrayed in the second direction and each configured to process substrates one by one, each of the first and second single substrate processing units having an inlet/outlet port facing the central portion of the single substrate transfer unit and configured for the single substrate transfer unit to load/unload substrates one by one therethrough; and
  the second processing area further includes second substrate supporting section interposed between the first and second single substrate processing units in the second direction and configured to support a plurality of substrates at intervals in a vertical direction, the second substrate supporting section having an inlet/outlet port facing the central portion of the single substrate transfer unit and configured for the single substrate transfer unit to load/unload substrates one by one therethrough.

12. The system according to claim 11, wherein the second processing area further includes additional single substrate processing units disposed above or below the first and second single substrate processing units and each configured to process substrates one by one, and the single substrate transfer unit is movable up and down to select an access target.

13. The system according to claim 12, wherein the first processing area further includes additional single substrate processing units disposed above or below the first and second batch processing units and each configured to process substrates one by one.

14. The system according to claim 12, wherein the second transfer area includes an additional single substrate transfer unit configured to transfer substrates one by one, and the additional single substrate transfer unit is rotatable coaxially with the single substrate transfer unit to select an access target.

15. The system according to claim 11, wherein each of the first and second batch processing units is configured to process a resist film formed on substrates by use of a process gas containing ozone and water vapor so as to denature the resist film to be soluble in water, and each of the first and second single substrate processing units is configured to perform a water-wash treatment for removing the resist film thus denatured to be soluble in water.

16. The system according to claim 15, further comprising an ozone supply source configured to supply the ozone only to selected one of the first and second batch processing units, and each of the first and second batch processing units further includes a water vapor supply source for generating the water vapor.

* * * * *